United States Patent [19]

Yamazaki et al.

[11] Patent Number: 4,971,667
[45] Date of Patent: Nov. 20, 1990

[54] PLASMA PROCESSING METHOD AND APPARATUS

[75] Inventors: Shunpei Yamazaki; Mitsunori Tsuchiya; Atsushi Kawano; Shinji Imatou; Kazuhisa Nakashita; Toshiji Hamatani; Takashi Inushima, all of Atsugi; Kenji Itou, Zama, all of Japan

[73] Assignee: Semiconductor Energy Laboratory Co., Ltd., Atsugi, Japan

[21] Appl. No.: 303,240

[22] Filed: Feb. 3, 1989

[30] Foreign Application Priority Data

| Feb. 5, 1988 | [JP] | Japan | 63-25919 |
| Feb. 5, 1988 | [JP] | Japan | 63-25920 |
| May 13, 1988 | [JP] | Japan | 63-117792 |
| Aug. 26, 1988 | [JP] | Japan | 63-212890 |
| Oct. 11, 1988 | [JP] | Japan | 63-255489 |

[51] Int. Cl.$^5$ .......................... C23F 4/04; C23C 14/44
[52] U.S. Cl. .......................... 204/192.32; 204/192.35; 204/298.34; 118/723; 156/345; 156/643; 427/38; 427/39; 422/186.05
[58] Field of Search .................... 204/192.32, 192.35, 204/192.3, 298 EP, 298.34; 118/723; 156/345, 643; 427/38, 39; 422/186.05

[56] References Cited

U.S. PATENT DOCUMENTS

| 4,464,223 | 8/1984 | Gorin | 156/643 |
| 4,572,759 | 2/1986 | Benzing | 156/345 |
| 4,581,100 | 4/1986 | Hatzakis et al. | 156/643 |
| 4,582,720 | 4/1986 | Yamazaki | 427/38 |
| 4,585,516 | 4/1986 | Corn et al. | 156/643 |
| 4,723,508 | 2/1988 | Yamazaki et al. | 118/723 |
| 4,808,553 | 2/1989 | Yamazaki | 437/100 |
| 4,844,775 | 7/1989 | Keeble | 156/643 |

Primary Examiner—Aaron Weisstuch
Attorney, Agent, or Firm—Sixbey, Friedman, Leedom & Ferguson

[57] ABSTRACT

A plasma process and an apparatus therefor are described. A number of substrates are disposed between a pair of electrodes, to which a high frequency electromagnetic power is applied in order to generate glow discharge and induce a plasma. The substrates in the plasma are additionally applied with an alternating electric field. By virtue of the alternating electric field, the substrates are subjected to sputtering action.

15 Claims, 9 Drawing Sheets

FIG.8A
FIG.8B
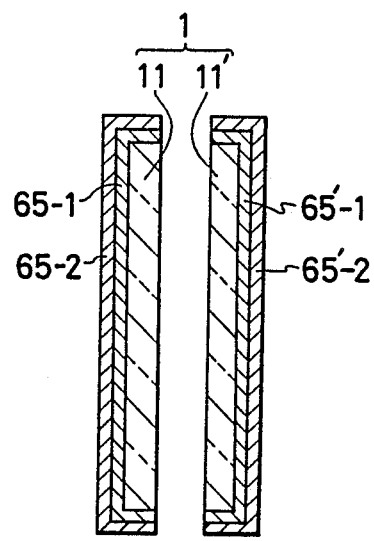
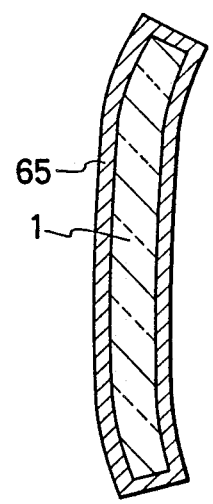

PLASMA PROCESSING METHOD AND APPARATUS

BACKGROUND OF THE INVENTION

The present invention relates to plasma processing method and apparatus.

Recently, a process for forming carbon films having a very high hardness has been developed utilizing chemical vapor reactions. An example is described in Japanese Patent Application No. sho56-146936 filed on Sept. 17, 1981. Carbon films of this type are very useful because of their high hardness while providing a smooth and corrosion-proof surface.

However, by use of the prior art apparatus and method, a large area or a number of substrates cannot be detected at once. Particularly, when an uneven surface is desired to be coated or processed, incomplete deposition takes place in depressed surface portions.

SUMMARY OF THE INVENTION

It is an object of the present invention to provide a plasma processing method and apparatus capable of performing a plasma process over a large processing area.

It is another object of the present invention to provide a plasma processing method and apparatus capable of processing a large number of electric devices.

In order to accomplish the above and other objects and advantages, a plasma of reactive gas is created between a pair of electrodes to which a high frequency power from an electromagnetic power source is supplied, and a number of substrates are disposed within the plasma space and supplied with an alternating electric power. Glow discharge takes place by applying a high frequency power between the pair of electrodes. By virtue of the alternating power supplied to the substrates, sputtering action is effected thereto. The sputtering action functions, during deposition, to enable deposition of an amorphous film, and during etching, to increase the etching speed. The carbon film deposited in accordance with the present invention is, for example, a so-called diamond-like carbon film whose Vickers hardness is expected to be 6500 $Kg/mm^2$ or higher depending on the formation condition. The energy gap is not lower than 1.0 eV, preferably 1.5 to 5.5 eV. When used for thermal heads which are frequently subjected to rubbing action, the smooth and hard surface of the carbon film is very advantageous. On the other hand, when used for integrated circuits of semiconductor devices, the low thermal conductivity coefficient of the carbon film makes it possible to dissipate heat generated in integrated circuits and thus prevent the circuits from suffering from a high temperature. It is also possible to fabricate a carbon film containing diamond particles by adjusting the deposition conditions.

Phosphorous or diborane may be introduced together with a carbon containing reactive gas in order to make the deposited film be semiconductive. After completion of the deposition, the reaction chamber may be cleaned by effecting plasma etching with argon by the plasma process in accordance with the present invention.

BRIEF DESCRIPTION OF THE DRAWINGS

FIGS. 8(A) and 8(B) are cross-sectional views showing the deposition of silicon nitride and fluoride containing carbon films on glass substrates.

DETAILED DESCRIPTION OF THE PREFERRED EMBODIMENTS

Figure 1:
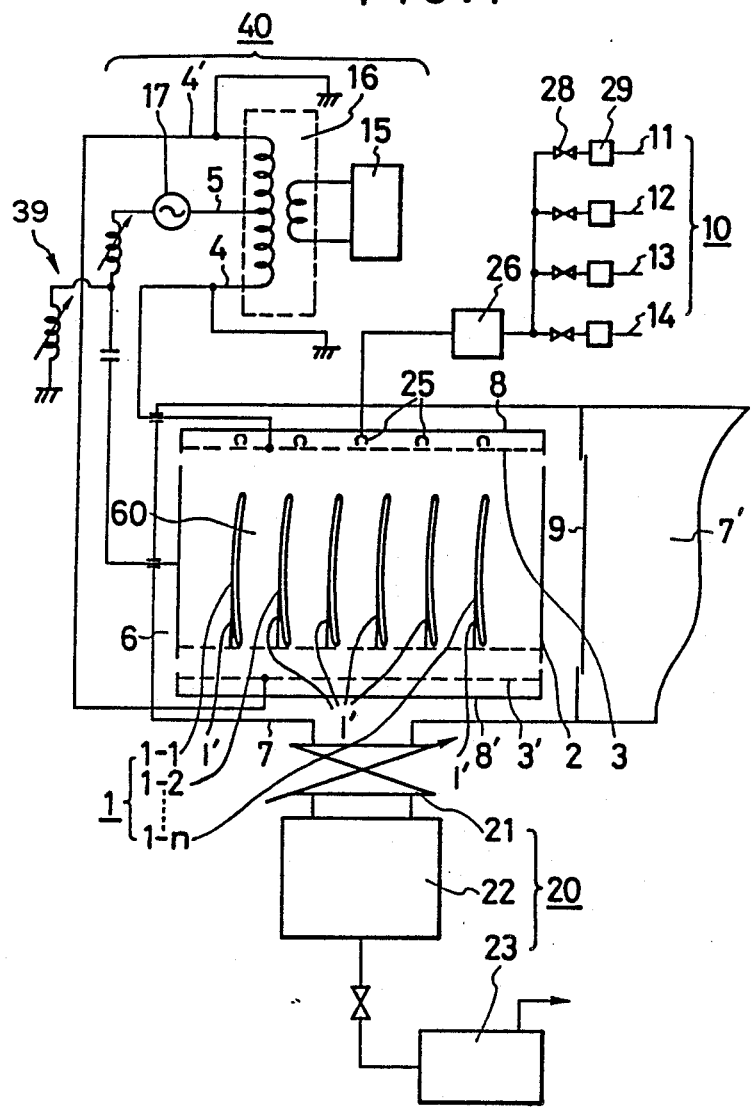
FIG. 1 is a schematic diagram showing a plasma chemical vapor reaction apparatus in accordance with the present invention.

Referring now to FIG. 1 showing a plasma CVD apparatus, a carbon film deposition is explained in accordance with the present invention. The apparatus comprises a loading and unloading chamber 7', a reaction chamber 7 connected to the loading chamber 7' through a gate valve 9, a vacuum system 20 provided for evacuating the reaction chamber 7 and consisting of a pressure control valve 21, a turbo molecular pump 22 and a rotary pump 23, a gas feeding system 10 for introducing a process gas into the reaction chamber 7 through nozzles 25, a substrate holder 1' functioning also as an electrode, a pair of mesh electrodes 3 and 3', and a high frequency electric energy supply or electromagnetic power source 40 connected with the substrate holder 1 and the mesh electrodes 3 and 3' and consisting of a high frequency power source 15, a matching transformer 16, an AC power source 17 and a bias applying device 39. A temperature controlling means (not shown in the figure) is provided in the chamber 7 in order to maintain the temperature of the reactive gas, e.g. between 450° C. and −100° C. The output frequency of the high frequency power source 15 is 1 to 50 MHz, e.g. 13.56 MHz. The pair of electrodes 3 and 3' are connected respectively to the ends 4 and 4' of the secondary coil of the transformer 16. The substrate holder 1' is connected to the midpoint of the secondary coil through the AC power source 17 and the bias applying device 39. The frequency of the AC source is 1 to 500 KHz, e.g. 50 KHz. The plasma generating space between the electrodes 3 and 3' is confined by a cylindrical enclosure 2 whose upper and lower openings are closed by a pair of lids 8 and 8'. The enclosure 2 is a four-sided cylinder of 20 cm to 1 m height and 30 cm to 3 m width. Optionally, a microwave excitation device 26 may be provided in association with the gas feeding system 10. For example, the device 26 energizes the reactive gas supplied from the gas feeding system 10 by microwaves at 2.45 GHz and at 200W to 2KW. By use of this device 26, the deposition speed and the etching speed are increased about 5 times and about 4 times respectively.

A method of depositing carbon films will be described hereinbelow. Substrates 1-1, 1-2, ... 1-n to be coated are placed in the loading chamber 7'. After evacuating the loading and reaction chamber 7 and 7', the substrates 1-n are transported to the reaction chamber 7 through the gate valve 9. In the illustration, the substrates 1-n are dishes. An aluminum film is coated on the rear surfaces of the dishes by vacuum evaporation. The substrate holder is adapted to support the dishes in electrical connection through the aluminum film.

A reactive gas is admitted to the reaction chamber 7 by the gas feeding system 10 through valves 28 and regulators 29. The reactive gas includes a carbon compound gas such as $CH_4$, $C_2H_4$, $C_2H_2$, $CH_3OH$ or $C_2H_5OH$. For example, $H_2$ and $CH_4$ are inputted through lines 11 and 12, respectively, at the same rate. The ratio of hydrogen contained in the carbon film to be subsequently deposited can be controlled by adjusting the proportion of hydrogen in the reactive gas. Preferably, hydrogen is contained in the films at not higher than 25 mol %. In addition to the reactive gas, a dopant gas may be introduced through lines 13 and 14. Examples of dopant impurities are N (not higher than 5 atom %), boron or phosphorus (0.1 to 5 atom %), and a halogen (not higher than 25 atom %). The dopant introduction is made respectively in the form of $NH_3$, $B_2H_6$, $PH_3$, and $C_2F_6$ or $C_3F_8$.

A high frequency electric power of 13.56 MHz is applied to the reactive gas from the high frequency power source 15 at 0.5 to 5 KW. The output power is equivalent to a plasma energy of 0.03 to 3 $W/cm^2$. For example, the output power is 1 KW (0.6 $W/cm^2$). On the other hand, an alternating electric power (voltage) of 50 KHz is applied to the substrate holder 1' by the AC power source 17. The substrates 1-1, 1-2, ... 1-n are biassed by $-200V$ to $+600V$ by the bias device 39. The actual bias potential at the substrates is $-400$ to $+400V$ since a self bias voltage is spontaneously applied thereto even without the application of an external bias. Preferably, the bias is applied so that the substrates function as cathodes. As a result, a plasma gas is generated if the reaction chamber 7 wherein carbon deposition takes place on the substrates within a plasma generating space 60. The deposition speed reaches 100 to 1000A/min in a highly dense plasma. When the deposition is carried out without the microwave power and a 100 to 300V bias voltage is superimposed on the high frequency electric power, the deposition speed is 100 to 200A/min. When the deposition is carried out with the microwave power and a 100 to 300V bias voltage is superimposed on the high frequency electric power, the deposition speed is 500 to 1000A/min. The pressure of the reactive gas is maintained at 1 to 0.01 Torr, e.g. 0.1 Torr in the reaction chamber 7. The substrate temperature is 50° to 150° C. without intentional heating. As a result, there is deposited an amorphous carbon film of 50A to 10 microns thickness on the substrates. The carbon film consists of an amorphous carbon which may contain, depending on the deposition condition, microcrystals of 5A to 2 microns diameter. The Vickers hardness of the carbon film is not lower than 2000 $Kg/mm^2$ and the thermal conductivity is not lower than 2.5 W/cm deg, preferably 4.0 to 6.0 W/cm deg. The carbon film is characterized by C—C bonds of $sp^3$ type. Reacted gas is removed through vacuum system 20.

An electric power at 1 GHz or a higher frequency, e.g. 2.45 GHz can break C—H bonds while C—C, C=C can be broken at 0.1 to 50 MHz, e.g. 13.56 MHz. The amount of hydrogen contained in the carbon films is preferably not higher than 25 mol %. Optionally, it is useful to add an impurity such as phosphorus, nitride or boron in order to fabricate n-type or p-type carbon semiconductors.

Figure 2A:
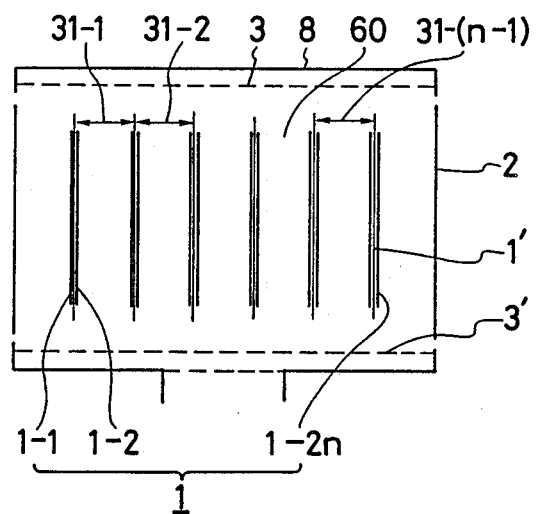
FIGS. 2(A), 2(B) and 2(C) are schematic diagrams showing modifications of the substrate holder of the apparatus illustrated in FIG. 1.
Figure 2B:
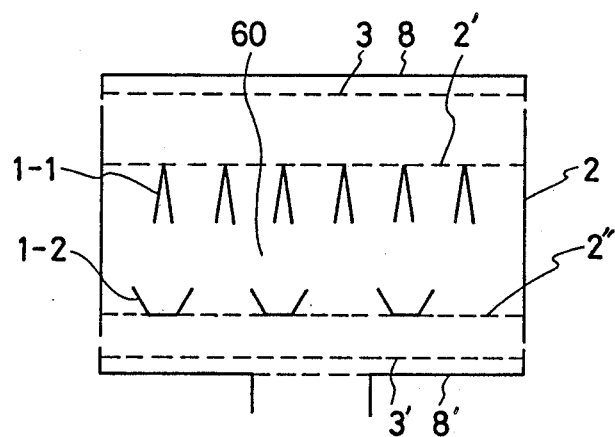

The substrate holder may be modified in accordance with the application, FIGS. 2(A) and 2(B) are schematic diagrams showing examples. In FIG. 2(A), a number of substrate holders 1' in plate form are integrally formed in the enclosure 2. A pair of substrates 1 are mounted on opposed sides of each holder 1'. The distance 31-1, 31-2, ... 31-(n-1) between each adjacent holder is chosen to be 6 to 10 cm. The size of the holder is 60 cm×30 cm. The substrates are mounted on the holders, except for the marginal portions of 10 cm from the lateral ends and 5 cm from the upper and lower ends, respectively. Then, the thickness of the carbon film becomes 1 micron ±5A. In order to suspend pincettes 1-1, a metallic mesh 2' may be provided in the enclosure 2 as shown in FIG. 2(B). Also, vessels 1-2 may be placed on a mesh 2".

Figure 2C:
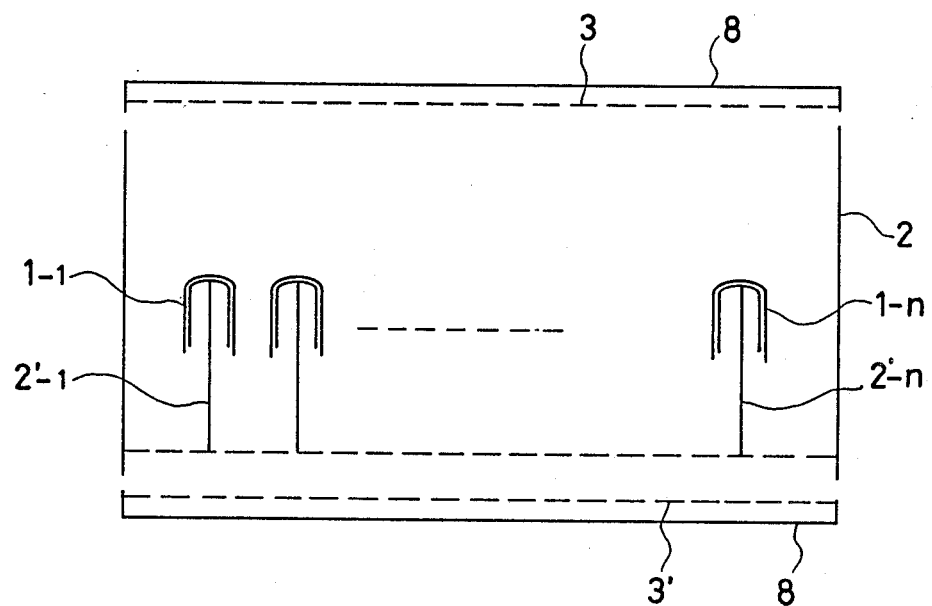

Although the rear surface of the substrate to be coated is preferably made conductive, the provision of a conductive coating may be dispensed with. An example is described in conjunction with FIG. 2(C). This example is devised to treat a number of drinking glasses. In the enclosure 2, a number of supporting members 2'-1 to 2'-n made of a conductive material such as aluminum are provided. The members are provided with glass receivers made of stainless steel in the form of glasses and adapted to make contact with the inner surface of glasses to be supported. In accordance with experiments, when the clearance between the inner surface of the glasses and the receivers is as narrow as 2 mm, carbon deposition could be carried out in the same manner as with the aluminum film directly coated on the inner surface of the glasses. However, when the distance between the glasses and the receivers reached about 10 mm, the effect of the conductive receivers could not be confirmed. Alternatively, aluminum foils may be interposed between the receivers and the glasses or replace the receivers.

The present invention can be applied to etching processes. After forming carbon films on a substrate, a mask is coated over the film and the coated and masked substrates placed in the chamber, followed by the introduction of an etchant gas into the reaction chamber 7. The etchant gas is for example $O_2$, air, $NO_2$, NO, $N_2O$, a mixture of oxygen and hydrogen, or another suitable oxygen containing compound. The plasma gas is generated in the same manner as in the depostion process to perform etching of the carbon film. Preferably, the substrate temperature is maintained at 100° to $-100°$ C. during etching. The pressure of the reactive gas is 0.01 to 1 Torr. An experiment is explained below.

Figure 3A:
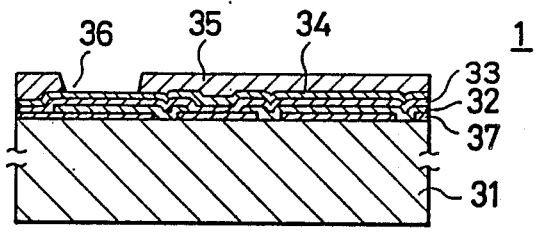
FIGS. 3(A) to 3(C) are cross sectional views showing a fabrication method of carbon patterns in accordance with the present invention.
Figure 3B:
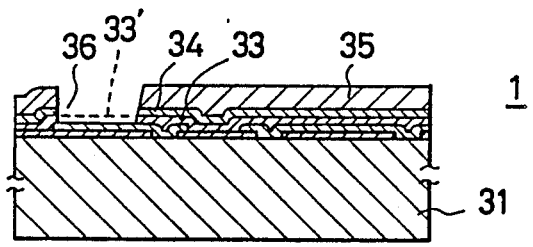
Figure 3C:
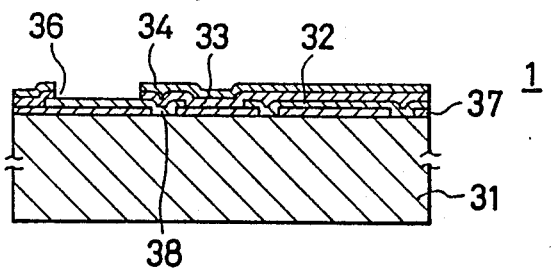

. A semiconductor device having a carbon film pattern was produced. The process is explained in conjunction with FIGS. 3(A) to 3(C). The device was formed on a silicon semiconductor substrate 31. On the substrate, a silicon oxide film 37 and a superconducting ceramic film 32 were formed and patterned respectively, followed by coating of a 0.5 micron blocking film 33 which prevents the underlying film 32 from being exposed to etching action. The blocking film 33 was made of $SiO_2$. Then, a carbon film 34 was deposited on the structure to a thickness of 0.1 to 2 microns, e.g. 0.5 micron. A photoresist pattern was formed on the carbon film 34 with an opening 36. The opening 36 is a bonding pad for making contact with an IC chip. The thickness of the photoresist pattern was selected so as not to expose the underlying surface, even if it was decreased by the following etching.

Next, oxygen gas was introduced to the reaction chamber and a high frequency power from the electromagnetic power source was inputted at 300W to perform etching of the carbon film 34. After completion of the etching, the photoresist 35 and a portion of the blocking film 33' at the opening was removed by etching using $NF_3$ or $SF_6$.

Alternatively, the conductive film 32 may be formed of Al, Ag or Si. The blocking film 33 may be formed of a phosphosilicate glass. The thickness of the blocking film may be 0.1 to 2 microns in general. Instead of the thick photoresist pattern, a silicon oxide pattern may be formed by coating silicon oxide film and etching the same with a photoresist. Silicon oxide does not suffer etching action from oxygen.

Superconducting ceramics for use in accordance with the present invention may be prepared consistent with the stoichiometric formula $(A_{1-x}B_x)_yCu_zO_w$, where A is one or more elements of GrouP IIIa of the Periodic Table, e.g. the rare earth elements, B is one or more elements of Group IIa of the Periodic Table, e.g. alkaline earth elements, and $x=0.1-1$; $y=2.0-4.0$, preferably 2.5-3-5; $z=1.0-4.0$, preferably 1.5-3.5; $w=4-0-10.0$, preferably 6.0-8.0. Also, superconducting ceramics for use in accordance with the present invention may be prepared consistent with the the stoichiometric formula $(A_{1-x}B_x)_yCu_zO_w$, where A is one or more elements of Group Vb of the Periodic Table such as Bi, Sb, and As; B is one or more elements of Group IIa of the Periodic Table, e.g. alkaline earth elements, and $x=0.3-1$; $y=2.0-4.0$, preferably 2.5-3.5; $z=1.0-4.0$, preferably 1.5-3.5; $w=4-0-10.0$, preferably 6.0-8.0. Examples of the latter general formula are $Bi_4Sr_yCa_3Cu_4O_x$, $Bi_4Sr_yCa_3Cu_4O_x$, $Bi_4Sr_yCa_3Cu_4O_x$, $Bi_4Sr_yCa_3Cu_4O_x$, $Bi_4Sr_yCa_3Cu_4O_x$, $Bi_4Sr_yCa_3Cu_4O_x$ (y is around 1.5).

Figure 4:
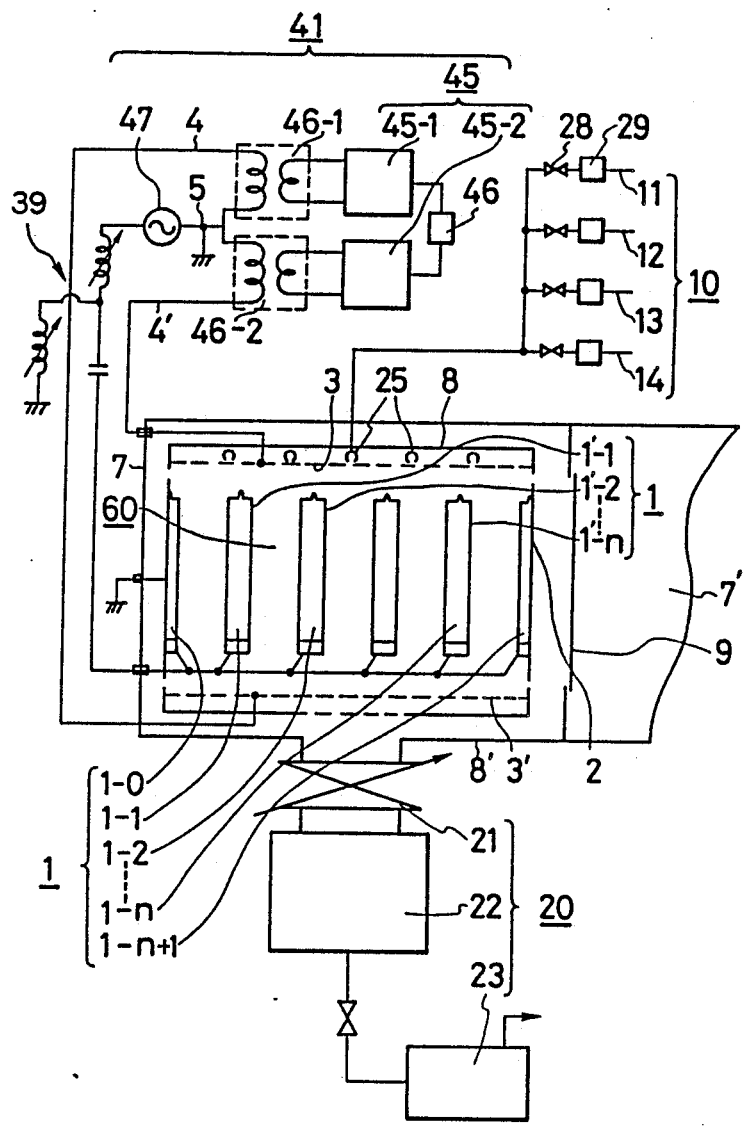
FIG. 4 is a schematic diagram showing another exemplary plasma processing apparatus in accordance with the present invention.

Referring now to FIG. 4, another embodiment is described. The similar elements as those described in FIG. 1 are given similar numerals and no redundant explanation for the elements will be given.

Particularly, the power source 41 characterizes the present embodiment. The source 41 comprises a pair of high frequency electromagnetic power sources 45-1 and 45-2 which are coupled by a phase shifter 46. The differential phase between the outputs of the sources 45-1 and 45-2 is controlled by means of the phase shifter 46. The outputs of the sources 45-1 and 45-2 are coupled to a pair of matching transformers 46-1 and 46-2 which, in turn, are coupled in series at respective terminals of the secondary coils of the transformers. The other terminals of the transformers 46-1 and 46-2 are connected to the pair of mesh electrodes in the same manner as the first embodiment. An AC power source 47 and a bias device 39 are connected between the pair of mesh electrodes 3 and 3'in the same manner as the first embodiment.

The relative phases of the electric powers applied to the electrodes 3 and 3' are controlled by means of the phase shifter 46. Namely, the potentials at the pair of electrodes 3 and 3' are maintained exactly in phase or in opposite phases. The phase difference may be adjusted at any suitable angle other than 0° or 180° in accordance with the condition of the electrodes about the circumference of the cylindrical enclosure 2.

Figure 5A:
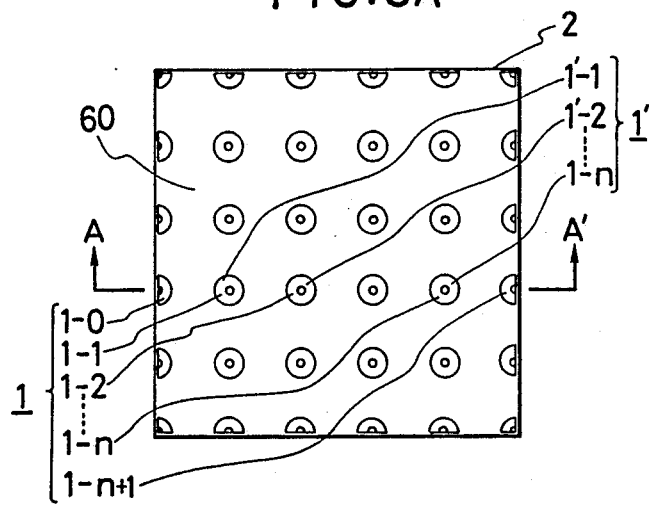
FIGS. 5(A) and 5(B) are plan views showing modifications of the substrate holder of the apparatus illustrated in FIG. 4.
Figure 5B:
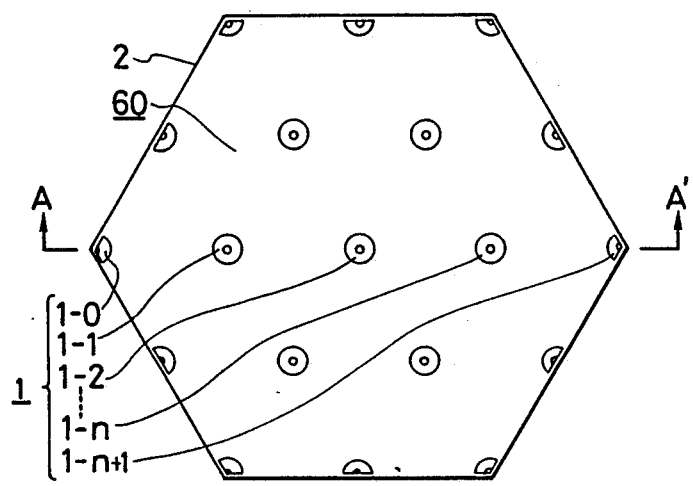

Next, an exemplary deposition method by use of the apparatus is expained. A number of printing drums for electrostatic copying machines are mounted on substrate holders 1' which are integrally formed in the cylindrical enclosure 2. The surface of the printing drums are coated with an organic photoconductive film in advance. The mounting condition of the drums in the rectangular enclosure of 75 cm width × 75 cm depth × 50 cm height is illustrated in FIG. 5(A). In the figure, 16 drums are mounted while dummy drums 1-0 are provided along the inner surface of the cylindrical enclosure 2 in order to make uniform the electric field induced in the plasma generating space 60, illustrated in FIG. 4. FIG. 5(B) shows drums mounted in a hexagonal enclosure.

$NF_3$ and $C_2H_2$ are introduced into the reaction chamber as a reactive gas. The ratio of $NF_3/C_2H_2$ is ¼ to 4/1, e.g. 1/1. By virtue of the high frequency power from the power source 45, plasma is induced and a carbon film is deposited on the drums. The carbon film is formed while being subjected to sputtering action which is mainly induced by the power from the power source 47. As a result, the carbon film becomes a diamond-like carbon film containing nitrogen at 0.3 to 10 atom % and fluorine at 0.3 to 3 atom %. The transparency and the resistivity of the diamond-like carbon can be controlled by varying the proportions of the nitrogen and fluorine contained therein. From the viewpoint of the application to printing drums, a suitable resistivity may be found in the range of $1 \times 10^7$ to $1 \times 10^{14}$ ohm-cm, preferably $1 \times 10^9$ to $1 \times 10^{11}$ ohm-cm.

Figure 6A:
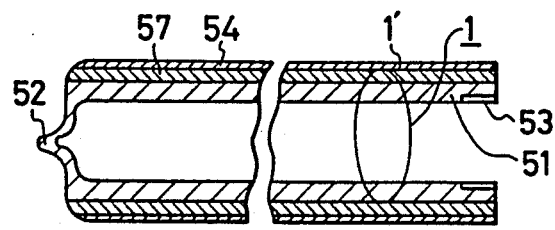
FIGS. 6(A) to 6(D) are cross sectional views showing the deposition of carbon films on OPC printing drums.
Figure 6B:
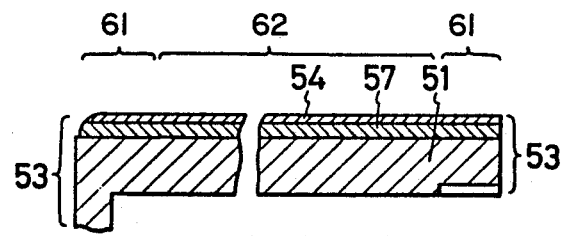
Figure 6C:
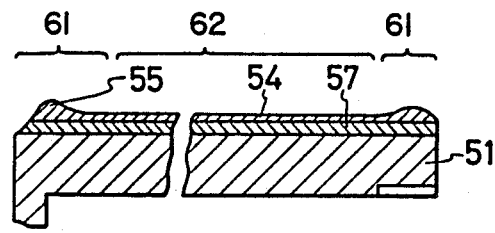
Figure 6D:
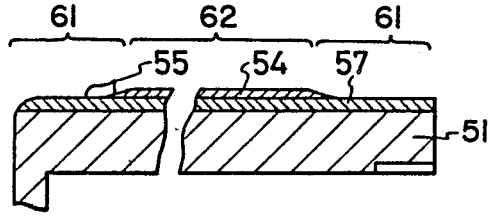

FIG. 6(A) is a cross sectional view showing the printing drum. The drum comprises an aluminum cylinder 51 whose one end is closed and provided with a projection 52 for enabling rotatable supporting of the drum in a copying machine. The inner surface of the other end of the drum is threaded at 53. A photosensitive dual film 57 consisting of an organic photoconductor film and a carrier transmission film is coated on the alminium cylinder 51. The carbon film 54 is formed covering the dual film 57. The thickness of the carbon film is 0.1 to 3.0 microns. FIG. 6(B) is an expanded partial view of FIG. 6(A). Since the drum is repeatedly subjected to rubbing action, there may occur the rubbing off of the end portions 61 of the carbon film. In order to strengthen the end portions, it is desirable to thicken the end portions, as illustrated in FIG. 6(C). The thickened portion 55 can be formed by locating the end portions near the mesh electrodes 3 and 3' and adjusting the plasma pressure in a range of 0.08 to 0.1 Torr. The configuration in FIG. 6(B) is realized when the plasma pressure is 0.05 Torr. Otherwise, the end portions of the carbon film may be dispensed with, leaving only the midsection 62 as shown in FIG. 6(D). This can be realized by adjusting the plasma pressure in a range of 0.01 to 0.04 Torr or by hiding the end portions with suitable covers.

After the completion of the deposition, the drums are removed from the chamber, and the inside of the chamber in which unnecessary carbon may be deposited is cleaned by introducing an etchant of oxygen and effecting plasma etching. Subsequently, $H_2$ Plasma etching is effected to eliminate oxide contaminants attached on the inside of reaction chamber. Other deposition and etching conditions are the same as the plasma process of the first embodiment.

Figure 7:
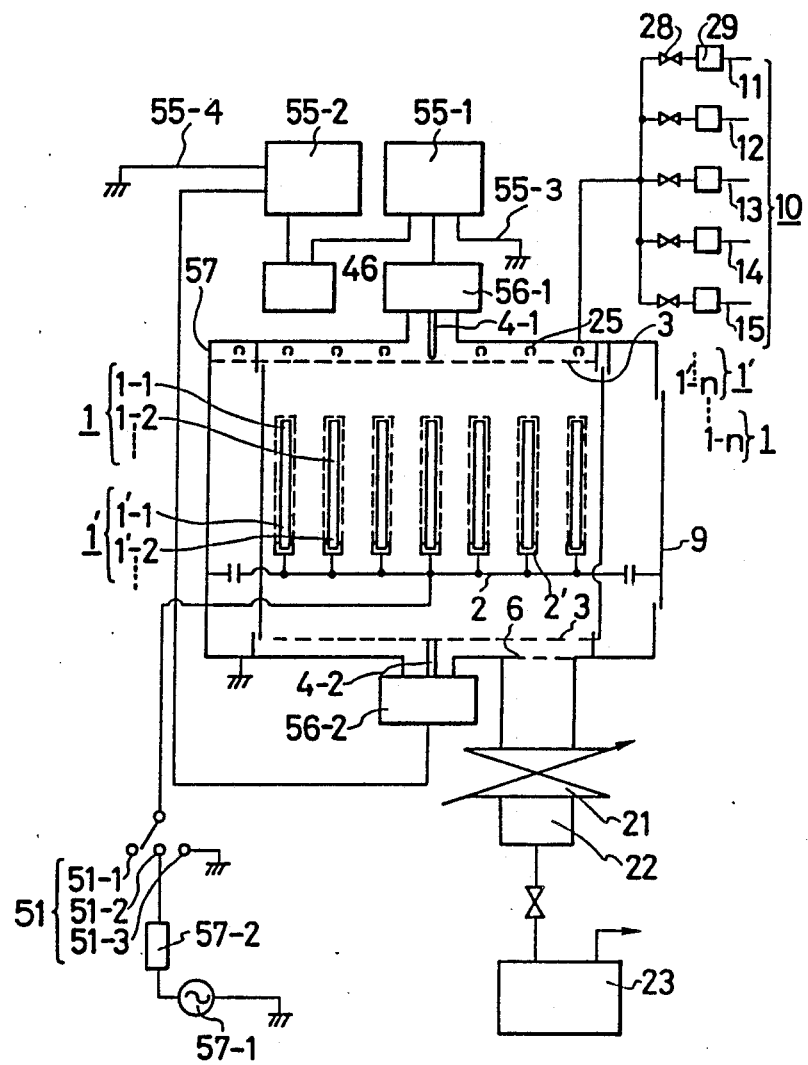
FIG. 7 is a schematic diagram showing a modification of the apparatus illustrated in FIG. 4.

A modification of the apparatus shown in FIG. 4 is illustrated in FIG. 7. Similar numerals are given to the similar elements in FIG. 7 as in FIG. 4. 56-1 and 56-2 are matching boxes of LCR with which the impedance matching between the electrodes 3 and 3' and the high frequency electromagnetic power sources 55-1 and 55-2 is set up. The matching boxes 56-1 and 56-2 are connected to the respective electrodes by connections 4-1 and 4-2. The electric power sources are provided with ground lines 55-3 and 55-4. The frequency of one of the electric power sources is equal to or a multiple of that of the other. An intermediate voltage supply is connected to the substrate holder 1' and comprised of an AC voltage source 57-1, a DC voltage source 57-2, and a three-way switch 51. The DC voltage source 57-2 functions to superimpose a DC bias voltage on the AC voltage from the AC voltage source 57-4. The frequency of the AC voltage source is 10 Hz to 100 KHz. With the switch 51, three states of bias application can be selected. The substrates 1 are rendered electrically floating at 51-1, applied with the AC voltage from the AC source 57-1 biassed by the DC voltage of the source 57-2 at 51-2, and grounded at 51-3. In this case, the input energy is 0.5 to 50 KW (0.005 to 5W/cm$^2$), for example, 1 KW (0.1W/cm$^2$).

The phase difference between the voltages at the electrodes 3 and 3' is adjusted in order to spread plasma gas over the whole deposition space. If the deposition system is exactly symmetrical with respect to the electrodes 3 and 3', the phase difference is 0° or 180°. However, depending on the asymmetry, the optimum value is displaced from 0° or 180°. In accordance with experiments, the optimum values were in a range of ±30° or 180°±30°. Plasma gas was collected mainly near one of the electrodes when the phase difference was around 90° or 270° (±30°).

Carbon films were deposited on printing drums 1' coated with organic photoconductive films in accordance with this embodiment. The reactive gas consisting of $C_2F_6/C_2H_4$ (=¼ to 4/1) was introduced to the chamber 57 downwardly from nozzles 25. The drums were not particularly heated and maintained in a range of room temperature to 150° C. A negative bias voltage of −50 to −600V was established by applying an AC bias voltage from the intermediate voltage supply. Other deposition conditions were the same as the first embodiment. Then, diamond-like carbon films containing fluorine of 0.1 to 8 microns thickness were formed on the drums at a deposition speed of 1000Å/min.

The formation was carried out in two steps. First, ethylene and hydrogen were used in order to deposit carbon thin films of 0.01 to 0.1 micron thickness which had a high adhesion to the organic surface of the drums. The resistivity of the films was $1 \times 10^6$- to $5 \times 10^{13}$ ohm-cm. Next, 0.2 to 2 microns thick carbon films were deposited on the underlying thin carbon films by use of a reactive gas consisting of $C_2F_6$ and $NH_3$. The resistivity of the films was $1 \times 10^7$ to $5 \times 10^{12}$ ohm-cm.

Referring to FIG. 8(A), the deposition of silicon nitride films and fluoride containing carbon films is explained. Glass substrates 1' are supported on the substrate holder 1. The substrates are, for example, front, side and rear window panes and side mirrors of motorcars, motor-cycles and airplanes, or windows of buildings. In this embodiment, a silicon nitride film 65-1, 65-1' is formed on the substrate in advance of carbon coating 65-2, 65-2' because glass tends to react with fluoride. The resistivity of the carbon films is adjusted to be $1 \times 10^6$ to $5 \times 10^{13}$ ohm-cm by controlling the introduction of fluoride in order to prevent gathering of dust due to electrostatic attraction. FIG. 8(B) shows the deposition on a curved surface.

While several embodiments have been specifically described, it is to be appreciated that the present invention is not limited to the particular examples described and that modifications and variations can be made without departure from the scope of the invention as defined by the append claims. Examples are as follow.

Since the thermal conductivity coefficient of carbon films formed in accordance with the present invention is very high, thermal diffusion of IC chips may be expedited by coating the rear surfaces with the carbon film in advance.

The substrate to be coated in accordance with the present invention may be made of any material, such as plastics, e.g. PET (polyethyleneterephthalate), PES, PMMA, Teflon, epoxy, polyimide or other organic resin. The shape of the substrate may includes several types, e.g. such having irregular surfaces.

The materials to be deposited on a substrate in accordance with the present invention include, other than carbon, silicon oxide, silicon nitride, or other materials.

An excellent speaker can be realized by utilizing a vibration cone whose inside and outside surfaces have been coated with a very hard carbon film in accordance with the present invention. The both side surface can be coated at once in a reaction chamber.

We claim:

1. A plasma processing method comprising:
   disposing at least one substrate in a reaction space;
   supplying a reactive gas into said reaction space wherein said reaction space is defined between a pair of electrodes where a first alternating electromagnetic power source is connected to the first of said pair of electrodes and a second alternating electromagnetic power source is connected to the second of said pair of electrodes and where the first electromagnetic power source is phase shifted with respect to the second electromagnetic power source;
   inducing a plasma in said reaction chamber by actuating said first and second electromagnetic power sources; and
   performing a plasma state reaction on the surface of said substrate,
   wherein an alternating electric power, whose frequency is lower than that of said first and second alternating electromagnetic power sources, is applied to said substrate during the plasma state reaction in order to expedite sputtering action on said substrate.

2. The method of claim 1 wherein said electromagnetic power sources have frequencies selected in a range of 1 to 50 MHz.

3. The method of claim 2 wherein said alternating power is selected in a range of 1 to 500 KHz.

4. The method of claim 1 wherein said electrodes are mesh electrodes.

5. The method of claim 1 wherein said first and second electromagnetic power sources are respectively connected to said pair of electrodes via a pair of transformers.

6. The method of claim 5 wherein said substrate is negatively biased by said alternating power.

7. The method of claim 5 wherein said alternating power is supplied from an alternating power supply connected between the midpoint of the secondary coils of said pair of transformers and said substrate.

8. The method of claim 7 wherein said plasma state reaction is deposition on said substrate.

9. The method of claim 7 wherein said plasma state reaction is the deposition of carbon films.

10. The method of claim 5 wherein the differential phase between the respective input powers to the pair of transformers is substantially 180° or 0°.

11. The method of claim 1 wherein the phase difference between the first and second electromagnetic power sources is in a range of −30° to =30° or 150° to 210°.

12. A plasma processing apparatus comprising:
a reaction chamber;
a gas feeding system for introducing a reactive gas into said reaction chamber;
a vacuum pump for evacuating said reaction chamber and maintaining the suitable gas pressure in said reaction chamber;
a pair of electrodes between which a plasma generating space is defined;
a substrate holder for supporting at least one substrate in said plasma generating space;
first and second alternating electromagnetic power sources respectively connected to said pair of electrodes;
phase shifting means for shifting the phase of the first electromagnetic power source with respect to the phase of the second electromagnetic power source; and
an alternating power supply for applying an alternating voltage to said substrate holder, the frequency of the alternating voltage being chosen so that the substrate supported by said substrate holder is substantially subjected to sputtering action of the plasma generated in the plasma generating space.

13. The apparatus of claim 12 wherein said plasma generating space is confined by an enclosure with which said substrate holder is integrally formed.

14. The apparatus of claim 12 wherein said substrate holder is provided with a conductive surface adapted to be in contact with a substrate to be supported by said holder.

15. The apparatus of claim 12 wherein the phase difference between the first and second electromagnetic power sources is in a range of −30° to +30° or 150° to 210°.

* * * * *